US007002387B2

(12) United States Patent
Donoghue et al.

(10) Patent No.: US 7,002,387 B2
(45) Date of Patent: Feb. 21, 2006

(54) SYSTEM AND METHOD FOR STARTUP BOOTSTRAP FOR INTERNAL REGULATORS

(75) Inventors: William J. Donoghue, Round Rock, TX (US); Chadwick N. Marak, Austin, TX (US)

(73) Assignee: California Micro Devices, Milpitas, CA (US)

( * ) Notice: Subject to any disclaimer, the term of this patent is extended or adjusted under 35 U.S.C. 154(b) by 41 days.

(21) Appl. No.: 10/825,720

(22) Filed: Apr. 16, 2004

(65) Prior Publication Data

US 2005/0231256 A1 Oct. 20, 2005

(51) Int. Cl.
*H03K 3/12* (2006.01)

(52) U.S. Cl. ....................................... 327/199; 327/540

(58) Field of Classification Search ................ 327/199, 327/143, 365, 390, 392, 538, 540, 541, 589; 323/234, 238, 265, 266, 282
See application file for complete search history.

(56) References Cited

U.S. PATENT DOCUMENTS 6,037,760 A * 3/2000 Borghi et al. ............... 323/282

* cited by examiner

*Primary Examiner*—Kenneth B. Wells
(74) *Attorney, Agent, or Firm*—Pillsbury Winthrop Shaw Pittman LLP

(57) ABSTRACT

A regulator circuit for use with integrated circuits protects downstream devices from the application of unregulated voltages during start-up or other initialization. The circuit includes an op amp which controls a regulator during steady state operation, and also includes a switching portion which responds to a reset signal and disconnects the op amp from the voltage regulator to prevent unregulated voltages from reaching the output node during start-up. During start-up, a current mirror is used to supply an initial voltage reference to the op amp, and upon establishment of steady state operation, the regulator turns off the current mirror and reconnects the op amp to the voltage regulator to allow the op amp and voltage regulator to control the output node.

12 Claims, 2 Drawing Sheets

SYSTEM AND METHOD FOR STARTUP BOOTSTRAP FOR INTERNAL REGULATORS

FIELD OF THE INVENTION

The present invention relates to power regulators generally, and more particularly relates to on-chip or internal voltage regulators.

BACKGROUND OF THE INVENTION

Voltage regulators for use with electronics circuits are well known. It is also known to include a voltage regulator on the die of an integrated circuit. The difficulty with typical internal voltage regulator comes when power is first applied and the system, including the internal regulator, is initializing and reaching a stable state.

In a typical arrangement, when power is first applied an unregulated voltage source is applied to the regulator circuit. The unregulated voltage source typically may vary over a very wide range, including well in excess of twenty volts in many instances, and much higher—in excess of eighty volts—in at least some instances. More importantly, such voltages may—at least briefly at startup—be applied to the primary circuit that the regulator is designed to protect.

While the components of many integrated circuits can withstand the higher voltages, some circuits have components which cannot. Thus, for example, it is well known that certain types of transistors cannot withstand applied voltages greater than ten volts; others cannot withstand applied voltages at higher levels, but would still be damaged if those levels were exceeded.

As a result, there has been a need for a startup regulator system and method which provides appropriate protection to the load circuit during the startup process while still permitting the regulator to function once the regulator has stabilized. In addition, there has been a need for a regulator which offers protection to load circuits where the initial applied voltages exceeds the typical damage threshold for those components, for example on the order of eighty volts.

THE FIGURES

SUMMARY AND DETAILED DESCRIPTION OF THE INVENTION

Figure 1:
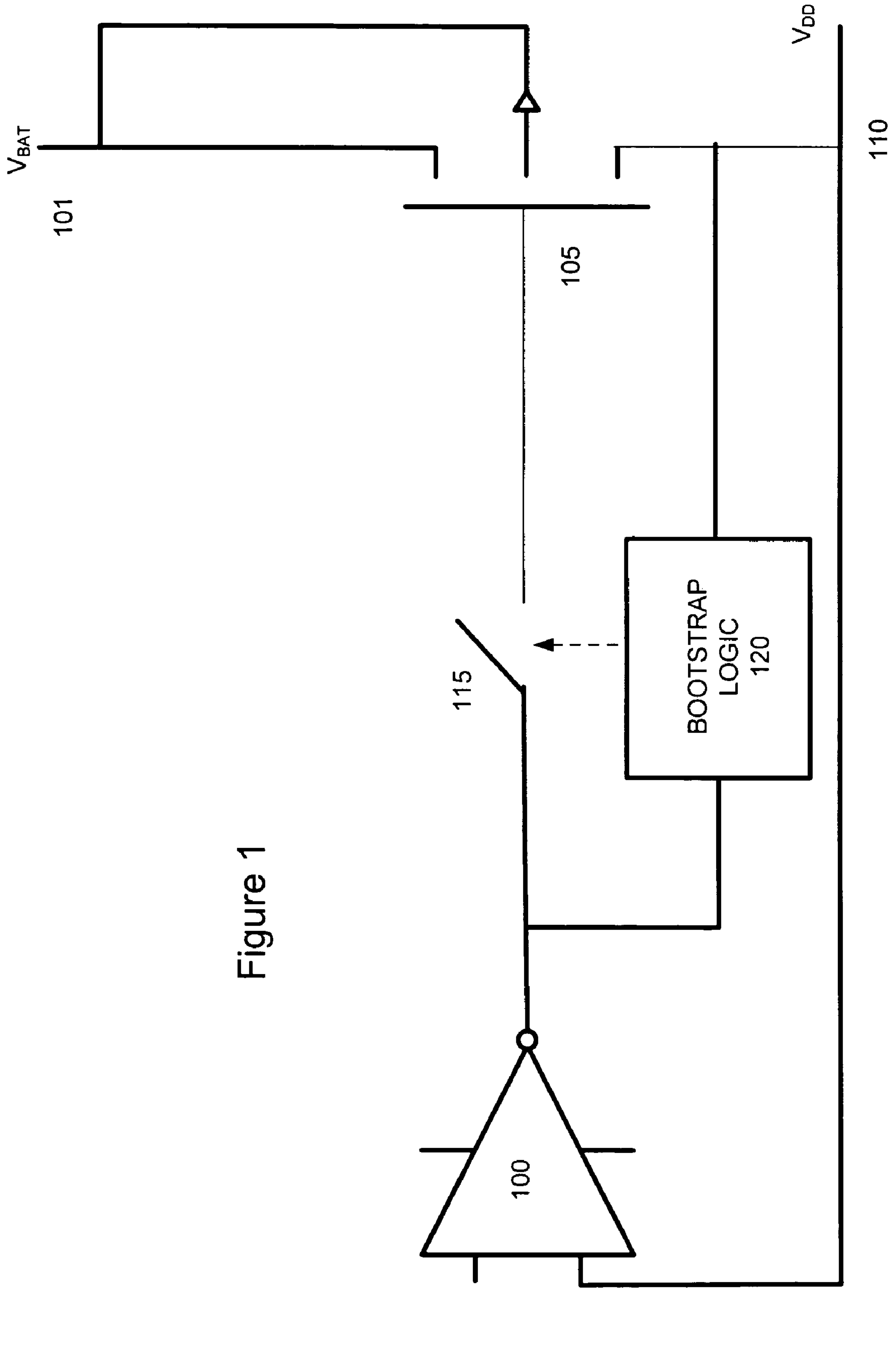
FIG. 1 illustrates in simplified schematic diagram form an exemplary arrangement of the present invention.

Referring to FIG. 1, an exemplary arrangement of the present invention is shown in simplified schematic view. On a very general level, the regulator of the present invention involves an operational amplifier (or "op amp") 100 connected in a negative feedback loop configuration through a transistor 105 to provide regulation of an output voltage at node 110, designated as $V_{DD}$, where the supply voltage 101 to the transistor 105, designated $V_{BAT}$, is unregulated. Essentially, the output of the op amp 100 controls the gate voltage of the transistor 105 to control the extent to which the supply voltage passes through the transistor 105 to the node 110. The output voltage $V_{DD}$ is supplied to the sense input of the op amp 100 to provide appropriate feedback. The result is that $V_{DD}$ is a regulated voltage source for downstream devices integrated into the same semiconductor substrate, or chip. Such downstream devices, which may take many forms, are not shown for the sake of clarity.

While the foregoing circuit works very well in normal operation, more complicated issues arise during the power-on, or initialization, process. While the power-on process is brief, significant damage can occur to the downstream devices if the unregulated voltage $V_{BAT}$ is applied to those downstream devices. To avoid this, during start-up a switch 115 disconnects the output of the op amp 100 from its direct connection to the gate of the transistor 105. By opening the switch 115, bootstrap logic 120 is allowed to control the node $V_{DD}$ until the output of the op amp 100 reaches a stable state, at which time the switch 115 again closes and the bootstrap logic 120 is effectively disconnected until the next initialization of the circuit. The regulator and bootstrap logic shown in detail in FIG. 1 illustrates an exemplary arrangement of the present invention that provides voltage protection and regulation during both start-up and steady state operation, with the objective of preventing unregulated voltages from appearing on the node $V_{DD}$ where such unregulated (and especially high) voltages might damage the downstream devices.

Figure 2:
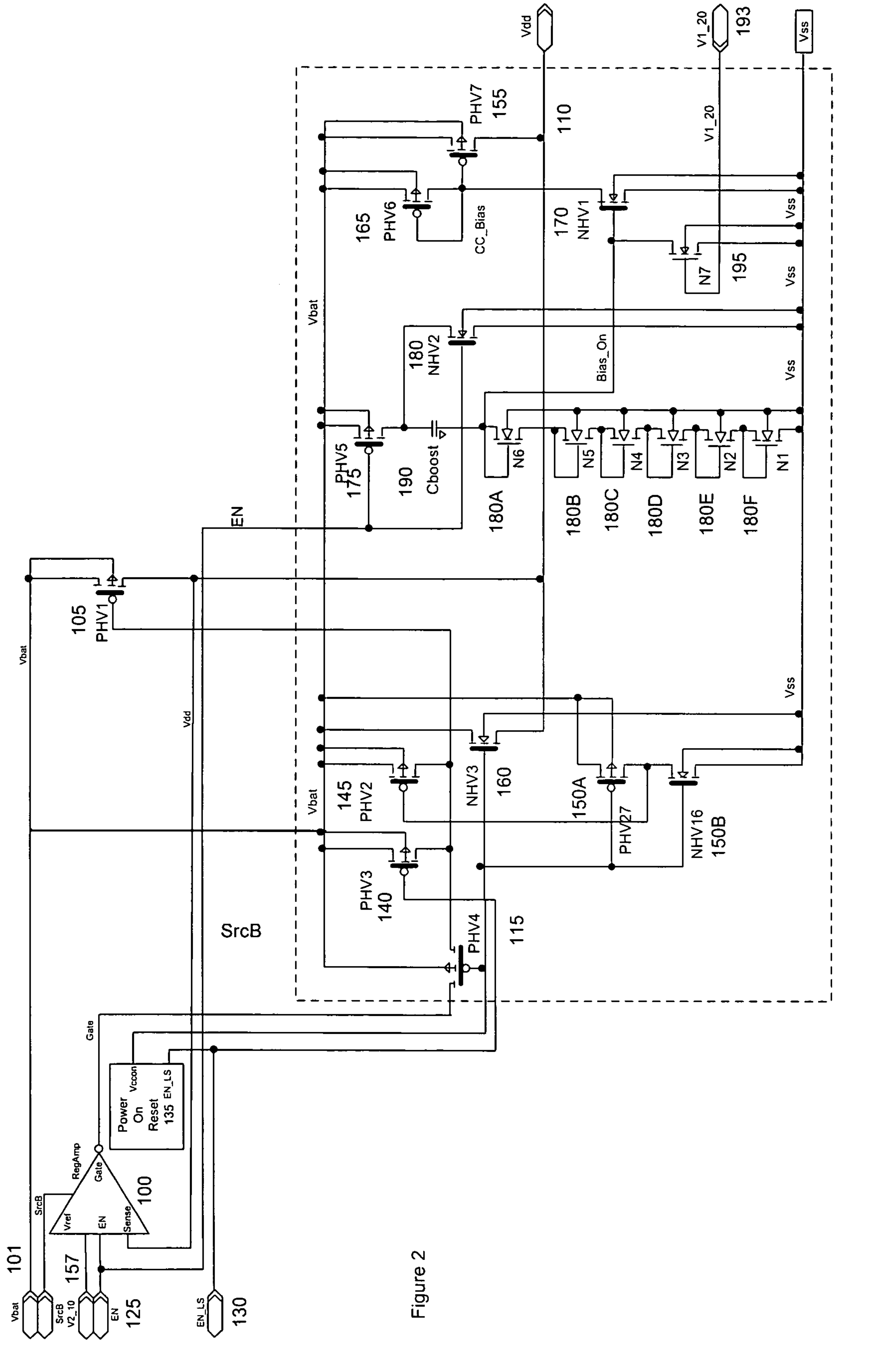
FIG. 2 illustrates in detailed schematic diagram form an exemplary implementation of the invention.

Referring next to FIG. 2, an exemplary arrangement of the present invention is shown in a more detailed schematic view. In normal operation, regulation of the output voltage $V_{DD}$ is achieved by using the GATE output of the op amp 100 to control the voltage applied to the gate of transistor 105, designated PHV1, where the unregulated voltage source, $V_{BAT}$, is supplied to the source of the transistor 105. The op amp 100 may for example be a typical NMOS differential op amp. By controlling the gate voltage, the voltage appearing at the drain of the transistor 110, which is the node 110 or $V_{DD}$, can be forced to the desired voltage, for example five volts, three volts, or any other desired voltage.

As discussed in connection with FIG. 1, while the foregoing regulation scheme works very well during normal operation, significant damage can occur during initialization, or start-up, of the circuit. At initialization, or start up, signals EN and EN_LS are applied on nodes 125 and 130, respectively. A Power On Reset circuit 135 applies a pulse on the line designated $V_{CCON}$, to initialize the circuit, after which the signal $V_{CCON}$ returns low until the chip is again initialized. To prevent the voltage $V_{BAT}$ from being applied to the node 110 at start-up, the transistor designated PHV4 operates as the switch 115, and responds to $V_{CCON}$ to disconnect the GATE output of the op amp 100 from the gate of the transistor 105, or PHV1. This allows the bootstrap circuitry, discussed in greater detail below, to control the voltage at node 110.

To ensure that the gate of transistor 105 is pulled high when the part is disabled, transistor 140, shown as PHV3, is connected between $V_{BAT}$ and the gate of transistor 105, with the gate of transistor 140 being controlled by the EN_LS signal from node 130. In addition, transistor 145, shown as PHV2, is connected between $V_{BAT}$ and the gate of transistor 105 to prevent transistor 105 from turning on when the signal $V_{CCON}$ is applied. The gate of the transistor 145 is controlled by transistor pair 150A–150B, shown as PHV27 and NHV16, which cooperate to keep transistor 145 fully on while $V_{CCON}$ is high, and fully off while $V_{CCON}$ is low and also provide a slight delay to prevent race conditions. The permits the op amp 100 to have full control of transistor 105 when the regulator is operating at steady state. Thus, during start-up, the transistor 105 is prevented from conducting, thereby permitting the circuitry shown in FIG. 2 below and to the right of transistor 105 to control the voltage which appears on node $V_{DD}$ during the transitional period.

To establish $V_{DD}$ while $V_{CCON}$ is high and transistor 105 is held off, a current mirrored transistor 155, shown as PHV7, supplies power to the node $V_{DD}$ to help establish the reference voltage $V_{2\_10}$. The reference voltage $V_{2\_10}$ shown on node 157 provides the $V_{REF}$ input to the op amp 100. A transistor 160, designated NHV3, also provides current and voltage to $V_{DD}$ while $V_{CCOON}$ is high. Transistors 165 and 170, designated as PHV6 and NHV1, mirror the current in branch CC_Bias into $V_{DD}$.

The gates of transistors 175 and 180, designated PHV5 and NHV2 are driven by the externally-supplied EN signal on node 125. When the EN signal is high, the voltage on the gate of transistor 170 is low, which allows $V_{BAT}$ to be applied to the capacitor $C_{BOOST}$, shown at 190. The voltage on the line 185, designated BIAS_ON, spikes as high as several diode drops; for example, six diode drops are shown in FIG. 2, with transistors 180A–F, designated in FIG. 2 as transistors N1 through N6. The diode drops provide a certain amount of regulation, but also allow the gate of transistor 170 to turn on, establishing the current mirror into $V_{DD}$ discussed above on the branch CC_Bias.

As the transistor 155, or PHV7, is allowed to turn on to deliver power to $V_{DD}$, the reference voltage $V_{2\_10}$ also starts to rise. As discussed above, voltage $V_{2\_10}$ provides the reference voltage $V_{REF}$ to the op amp 100, so that the increase in $V_{2\_10}$ allows the op amp 100 to begin to take over. At the same time, another reference voltage, $V_{1\_20}$, shown at node 193, also starts to rise and, by turning on transistor 195 shown as N7, slowly pulls down the gate of transistor 170, or NHV1, so that the current mirror is shut off. This enables the op amp 100 to have entire control of the transistor 105, and therefore control of the regulation of $V_{DD}$. It will be appreciated that the current mirror does not turn off until the voltage references $V_{1\_20}$ and $V_{2\_10}$ are established and these voltages are, in at least an exemplary arrangement, established from the same resistive tree. By virtue of this approach, availability of a +5 v internal supply is assured. It will be appreciated by those skilled in the art that the reference voltages $V_{1\_20}$ and $V_{2\_10}$ may be provided by different branches of a resistive tree, and thus start to rise slowly to their reference values when power is first applied.

It will also be appreciated that, in some instances, $V_{BAT}$ may already be asserted even though the outside enable signal EN is kept low. In this instance, the part is off, and no power is consumed. In such circumstances, when the enable signal EN is switched high, the initial inrush of current onto the capacitor $C_{BOOST}$ through transistor 175 causes the same spike on the node BIAS_ON, which again turns on transistor 170 and the current mirror CC_BIAS, thus sending power to $V_{DD}$.

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

We claim:

1. A bootstrap regulator circuit comprising
   an op amp which generates a control signal during steady state operation,
   a regulator for providing an output signal and responsive to the control signal,
   a switch operatively connected to disconnect the control signal from the regulator during initialization,
   a bootstrap circuit connected substantially in parallel with the switch such that, when the switch is opened, the bootstrap circuit substantially controls the output signal during initialization, and when the switch is closed, the bootstrap circuit has substantially no effect on the output signal.

2. The bootstrap regulator circuit of claim 1 wherein the bootstrap circuit is in parallel with both the switch and the regulator.

3. The bootstrap regulator circuit of claim 1 wherein the switch is a FET.

4. The bootstrap regulator circuit of claim 1 configured to be implemented in an integrated circuit.

5. The bootstrap regulator circuit of claim 1 wherein the opening of the switch is controlled by the bootstrap circuit.

6. The bootstrap regulator circuit of claim 1 wherein the bootstrap circuit is capable of preventing unregulated voltages in the range of up to 30 volts from being applied to downstream devices.

7. The bootstrap regulator circuit of claim 1 wherein the bootstrap circuit is capable of preventing unregulated voltages in the range of up to 80 volts from being applied to downstream devices.

8. A bootstrap regulator circuit comprising
   an op amp which generates a control signal during steady state operation,
   a regulator for providing an output signal and responsive to the control signal,
   a switch operatively connected to disconnect the control signal from the regulator during initialization,
   a bootstrap circuit connected substantially in parallel with the switch and the regulator, and which controls the operation of the switch such that, when the switch is opened, the bootstrap circuit substantially controls the output signal during initialization to prevent unregulated voltages from being applied to downstream devices and, when the switch is closed, the bootstrap circuit has substantially no effect on the output signal.

9. The circuit of claim 8 wherein the circuit and the downstream devices are implemented on a single die.

10. A method for preventing unregulated voltages from being applied to downstream devices during initialization of a circuit comprising the steps of
   providing a regulator which, during steady state operation, receives at one input an unregulated voltage and supplies at its output a regulated voltage to an output node,
   detecting an initialization event,
   preventing the unregulated voltage from being applied to the output node substantially when the initialization event begins by disabling the regulator,
   establishing a reference voltage which increases during the initialization event and reaches a steady state value by the end of the initialization event,
   enabling the regulator in response to the reference voltage reaching substantially steady state value.

11. The circuit of claim 8 in which the bootstrap circuit establishes its own reference voltage to control the operation of the switch.

12. A regulator circuit for use in solid state devices comprising
   A bootstrap regulator circuit comprising
      an op amp which generates a control signal during steady state operation,
      a regulator for providing an output signal to an output node and responsive to the control signal, a switch connected between the op amp and the regulator to disconnect the control signal from the regulator in response to a reset signal, a bootstrap circuit, responsive to a reference voltage, for generating a bias voltage which controls the output node from the time the reset signal is applied until the reference voltage reaches substantially steady state, the bootstrap circuit further causing the switch to reconnect the control signal to the regulator when the voltage reference reaches a substantially steady state value.

* * * * *